(12) United States Patent
Albrecht

(10) Patent No.: US 7,209,506 B2
(45) Date of Patent: Apr. 24, 2007

(54) OPTICALLY PUMPED SEMICONDUCTOR DEVICE AND METHOD FOR PRODUCING IT

(75) Inventor: Tony Albrecht, Bad Abbach (DE)

(73) Assignee: Osram Opto Semiconductors GmbH, Regensburg (DE)

(*) Notice: Subject to any disclaimer, the term of this patent is extended or adjusted under 35 U.S.C. 154(b) by 229 days.

(21) Appl. No.: 10/903,411

(22) Filed: Jul. 30, 2004

(65) Prior Publication Data

US 2005/0058171 A1 Mar. 17, 2005

(30) Foreign Application Priority Data

Jul. 31, 2003 (DE) ................ 103 35 539
Sep. 5, 2003 (DE) ................ 103 41 085

(51) Int. Cl.
*H01S 5/00* (2006.01)
*H01S 3/14* (2006.01)
*H01S 3/091* (2006.01)
*H01S 3/082* (2006.01)

(52) U.S. Cl. .................. 372/50.124; 372/68; 372/75; 372/97; 438/29; 438/31; 438/32; 438/47; 257/98

(58) Field of Classification Search ........... 372/50.1, 372/50.11, 50.124, 68, 75, 97; 438/29, 31, 438/32, 46, 47; 257/98
See application file for complete search history.

(56) References Cited

U.S. PATENT DOCUMENTS 6,285,704 B1* 9/2001 Kullander-Sjoberg et al. ... 372/96
6,947,460 B2* 9/2005 Spath et al. ............. 372/43.01
7,023,894 B2 4/2006 Albrecht 2002/0001328 A1* 1/2002 Albrecht et al. ............. 372/50

(Continued)

FOREIGN PATENT DOCUMENTS

DE 100 26 734 A1 12/2001

(Continued)

OTHER PUBLICATIONS

T. K. Ong et al., "High spatial-resolution quantum-well intermixing process in GaIn/As/GaInAsP laser structure using pulsed-photoabsorption-induced disordering", Journal of Applied Physics, vol. 87, No. 6, Mar. 15, 2000, pp. 2775-2779.

(Continued)

*Primary Examiner*—Minsun Oh Harvey
*Assistant Examiner*—Hrayr A. Sayadian
(74) *Attorney, Agent, or Firm*—Cohen Pontani Lieberman & Pavane LLP

(57) ABSTRACT

An optically pumped radiation-emitting semiconductor device with a surface-emitting quantum well structure (10), which has at least one quantum layer (11), and an active layer (8) for generating pump radiation (9) for optically pumping the quantum well structure (10), which is arranged parallel to the quantum layer (11). The semiconductor device has at least one emission region (12), in which the quantum well structure (10) is optically pumped, and at least one pump region (13). The quantum well structure (10) and the active pump layer (8) extend over the pump region (13) and over the emission region (12) of the semiconductor device, and the pump radiation (9) is coupled into the emission region (12) in the lateral direction.

17 Claims, 2 Drawing Sheets

U.S. PATENT DOCUMENTS

| | | | |
|---|---|---|---|
| 2002/0075935 A1* | 6/2002 | Clayton ........................ | 372/75 |
| 2003/0179802 A1* | 9/2003 | Albrecht ..................... | 372/96 |
| 2004/0042523 A1* | 3/2004 | Albrecht et al. ............. | 372/70 |
| 2004/0131101 A1* | 7/2004 | Albrecht ..................... | 372/70 |
| 2004/0141538 A1* | 7/2004 | Schmid et al. ................ | 372/70 |
| 2004/0208217 A1* | 10/2004 | Brick et al. ................... | 372/50 |
| 2005/0169340 A1* | 8/2005 | Anikitchev et al. .......... | 372/75 |
| 2005/0226302 A1* | 10/2005 | Lutgen ........................ | 372/70 |
| 2006/0104327 A1* | 5/2006 | Karnutsch et al. ..... | 372/50.124 |

FOREIGN PATENT DOCUMENTS

| | | |
|---|---|---|
| DE | 101 29 616 A1 | 1/2003 |
| DE | 102 48 768 A1 | 5/2004 |
| EP | 0 269 359 A2 | 6/1988 |
| EP | 1 220 392 A2 | 7/2002 |
| WO | WO 01/93386 A1 | 12/2001 |

OTHER PUBLICATIONS

J. Ralston, et al., "Intermixing of $Al_xGa_{1-x}AS/GaAs$ superlattices by pulsed laser irradiation", Applied Physics Letter, vol. 50, No. 25, Jun. 22, 1987, pp. 1817-1819.

J. H. Marsh, "Laser induced quantum well intermixing for optoelectronic devices", pp. 380-381.

Michael D. Gerhold et al., "Novel Design of a Hybrid-Cavity Surface-Emitting Laser", IEEE Journal of Quantum Electronics, vol. 34, No. 3, Mar. 1998.

J. H. Marsh, "Laser induced quantum well intermixing for optoelectronic devices", Conference Proceedings, LEOS 1996, 9th Annual Meeting, IEEE Lasers and Electro-Optics Society 1996 Annual Meeting (Cat. No. 96CH35895) vol. 2, pp. 380-381.

* cited by examiner

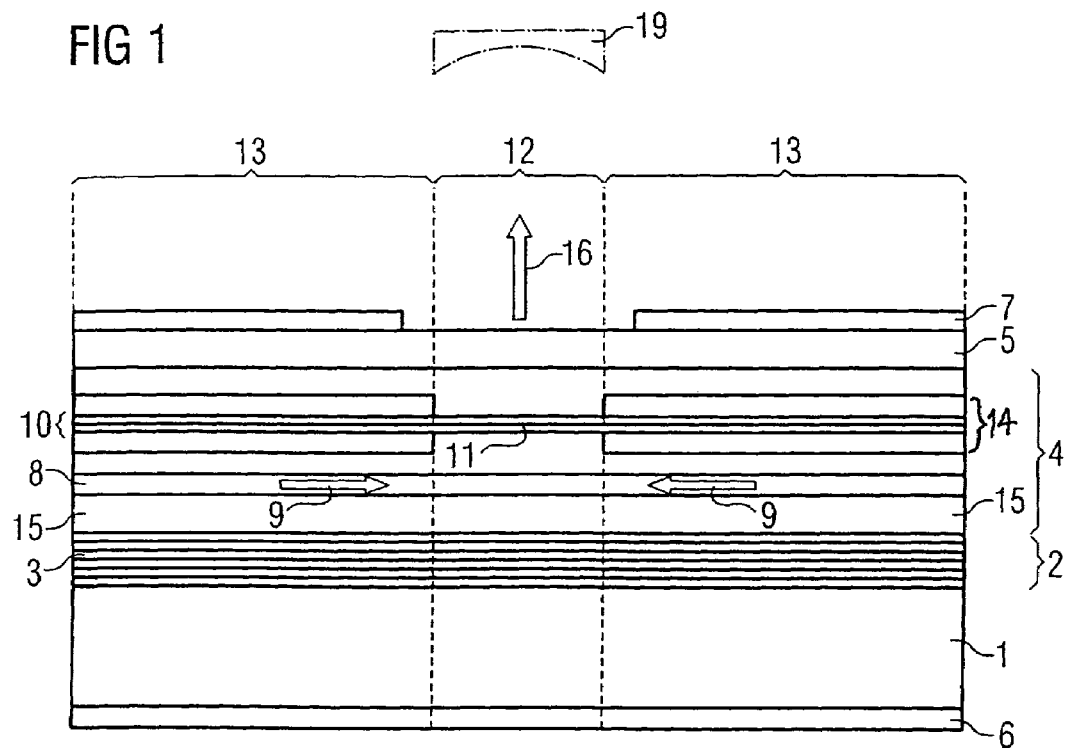
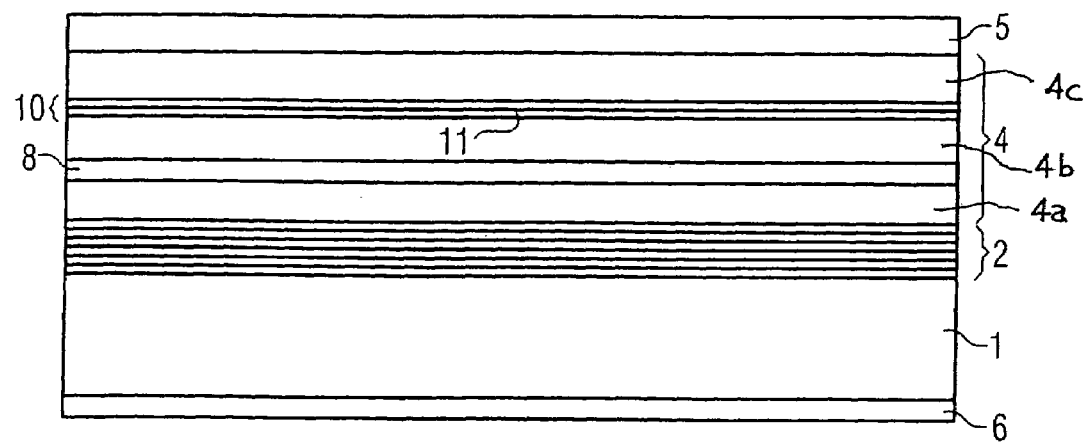

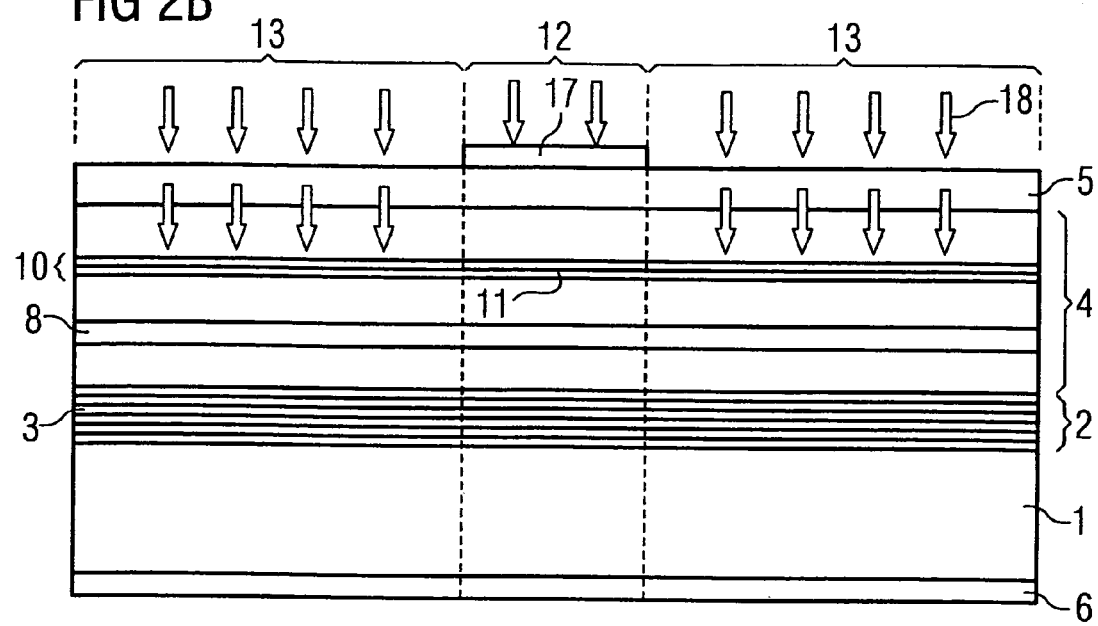
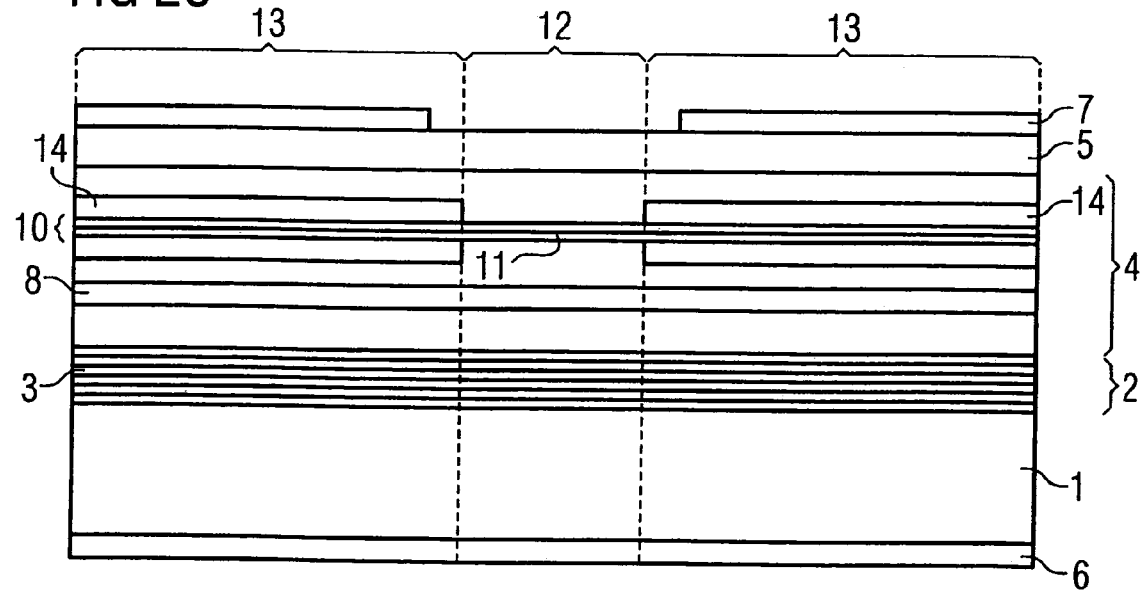

OPTICALLY PUMPED SEMICONDUCTOR DEVICE AND METHOD FOR PRODUCING IT

CROSS-REFERENCE TO RELATED APPLICATIONS

The content of the patent application DE 103 35 539.1 and DE 103 410 85.6, the priority of which is claimed for the present application, is hereby incorporated by reference in the present description.

FIELD OF THE INVENTION

The invention relates to an optically pumped radiation-emitting semiconductor device and to a method for producing it.

BACKGROUND OF THE INVENTION

Semiconductor devices of this type are disclosed for example in the document US 2002-0001328. The optically pumped surface-emitting semiconductor device described therein comprises a central surface-emitting quantum well structure, downstream of which pump radiation sources are arranged in the lateral direction. The quantum well structure and the pump radiation source are grown epitaxially onto a common substrate.

Two epitaxy steps are generally necessary during the production of such a semiconductor device: in a first epitaxy step, a semiconductor layer sequence for the quantum well structure is grown onto a suitable substrate. Afterwards, a part of this layer sequence is removed marginally, so that only the central quantum well structure remains. A semiconductor layer sequence for the pump radiation source is then grown onto the uncovered regions in a second epitaxy step.

In order to reduce the production effort it would be desirable to be able to dispense with one epitaxy step or to produce a semiconductor device of this type by means of a single epitaxy step. This would reduce in particular the time required for epitaxy, so that the component could be manufactured more rapidly and thus significantly more cost-effectively.

For this purpose, the semiconductor device could be grown onto a patterned, non-planar substrate in one epitaxy step. However, this requires specially made substrates, so that, as a result, although the production outlay for the epitaxial layers decreases, by the same token there is, on the other hand, an increase in the production outlay for the substrates.

SUMMARY OF THE INVENTION

It is an object of the present invention to provide a semiconductor device of the type mentioned above the production of which requires a technical effort that is as low as possible. In particular, the intention is that the semiconductor device can be produced in one epitaxy step. Furthermore, it is an object of the present invention to specify a corresponding production method.

These and other objects are attained in accordance with one aspect of the present invention directed to an optically pumped radiation-emitting semiconductor device with a surface-emitting quantum well structure, which has at least one quantum layer, and with an active pump layer for generating pump radiation for optically pumping the quantum well structure, which is arranged parallel to the quantum layer. The semiconductor device has an emission region, in which the quantum well structure is optically pumped, and a pump region. The quantum layer and the active pump layer extend over the pump region and over the emission region of the semiconductor device, and the pump radiation is coupled into the emission region in the lateral direction.

In this case, the invention is based on the idea of forming an emission region and a pump region in the case of the semiconductor device with the surface-emitting quantum well structure and the active pump layer of the pump radiation source extending over the emission region and the pump region, but the quantum well structure generating radiation only within the emission region. This can be achieved by means of suitable measures that will be described in more detail below, for example a disordering of the quantum well structure outside the emission region. Such a semiconductor device can advantageously be produced in one epitaxy step. In comparison with a conventional semiconductor device, which is manufactured by means of two epitaxy steps, a significant reduction of the production effort is achieved by means of the invention.

Preferably, the active pump layer and the quantum well structure are arranged within a common waveguide. This brings about a guidance of the pump radiation within the waveguide (optical confinement), which leads to advantageously large overlap between the pump radiation field and the quantum well structure. This advantageously increases the coupling-in efficiency of the pump radiation into the quantum well structure.

In an advantageous refinement of the invention, the absorption wavelength of the quantum well structure is greater than the wavelength of the pump radiation within the emission region and is less than the wavelength of the pump radiation outside the emission region. For this purpose, preferably, the quantum well structure is at least partly disordered outside the emission region. Since the pump radiation is substantially absorbed only in the regions in which the absorption wavelength is greater than the wavelength of the pump radiation, the pump radiation can be guided essentially without absorption losses in the pump region toward the emission region. In particular, this avoids an absorption of the pump radiation outside the emission region in the—for example disordered—quantum well structure. Correspondingly, the surface-emitting quantum well structure is not optically pumped outside the emission region and does not generate any radiation there either. In an advantageous manner, it is thus possible to grow both the quantum well structure and the active pump layer as laterally continuous layers or layer sequences in one epitaxy step without the need for a removal and a renewed growth of semiconductor layers in a second epitaxy step. This considerably simplifies the manufacture of the semiconductor device in the form of a monolithically integrated component, that is to say in which the quantum well structure and the active pump layer are grown on a common epitaxial substrate.

In the context of the invention, a quantum well structure is also to be understood to be any layer or layer sequence which is formed by means of a quantum well structure. In particular, this layer or layer sequence may emerge from a quantum well structure by means of disordering or a different modification. Correspondingly, the regions of the surface-emitting quantum well structure which extend from the emission region into the pump region are also referred to as quantum well structure in the pump region, even if the characteristic properties of a quantum well structure are partly or even completely eliminated by means of the disordering or a different modification.

In a preferred development of the invention, one or a plurality of pump lasers are formed for generating the pump radiation, the active pump layer constituting the laser-active medium. By means of the laser amplifying process and also a suitable resonator geometry, the pump radiation field can be adapted spectrally and spatially precisely to the surface-emitting quantum well structure to be pumped and an advantageously high coupling-in efficiency can thus be achieved.

Preferably, the resonator of the pump laser is delimited by opposite side areas of the semiconductor device, so that, as seen in the vertical direction, the quantum well structure to be pumped is arranged in a manner at least partly overlapping the pump laser resonator.

Preferably, the semiconductor device in the case of the invention is configured as a semiconductor disc laser. Such a semiconductor disc laser represents a surface-emitting laser with an external resonator, i.e. the resonator of the surface emitter is formed with an external element, for example an external resonator mirror. Corresponding to this external mirror, an internal resonator mirror arranged downstream of the emission region in the vertical direction is provided as the second resonator mirror for the surface emitter in the case of the invention. In particular, the said internal resonator mirror may be formed as a Bragg mirror.

Another aspect of the invention is directed to a method for producing an optically pumped radiation-emitting semiconductor device with a surface-emitting quantum well structure, which has at least one quantum layer, and an active pump layer for generating pump radiation for optical pumping of the quantum well structure, which is arranged parallel to the quantum layer. The semiconductor device has an emission region, in which the quantum well structure is optically pumped, and a pump region. The quantum layer and the active pump layer extend over the pump region and over the emission region of the semiconductor device, and the pump radiation is coupled into the emission region in the lateral direction.

Firstly, a suitable growth substrate is provided, afterward a semiconductor layer sequence comprising the active pump layer for generating the pump radiation and a semiconductor layer sequence comprising the surface-emitting quantum well structure with at least one quantum layer are grown, an emission region and a pump region are defined, and the surface-emitting quantum well structure is disordered in the pump region.

In an advantageous manner, the semiconductor layer sequence comprising the active pump layer and the semiconductor layer sequence comprising the quantum well structure can be produced in a single, common epitaxy step. The disordering of the quantum well structure in the pump region reduces the absorption wavelength of the quantum well structure in the pump region, so that the pump radiation, within the pump region, is not emitted in the surface-emitting quantum well structure. No disordering takes place in the emission region, by contrast, so that the pump radiation is absorbed there and the surface-emitting quantum well structure is thus optically pumped.

Preferably, the quantum well structure is disordered by irradiation with electromagnetic radiation, particularly preferably by means of a laser (PAID, Photo-Absorption-Induced Disordering). In this case, the wavelength of the radiation is chosen such that it is absorbed in the pump region in the surface-emitting quantum well structure. The absorption leads to local heating which brings about a disordering of the quantum layers when a given temperature is exceeded.

In order to avoid excessively great heating of the entire semiconductor device, an irradiation with short pulses for example by means of a pulsed laser, is advantageous (P-PAID, Pulsed Photo-Absorption-Induced Disordering).

In an advantageous development of the method according to the invention, the wavelength of the electromagnetic radiation is chosen such that it is absorbed in the surface-emitting quantum well structure in the pump region, but not in the pump layer. This prevents a disordering of the active pump layer, which may likewise comprise a quantum well structure.

In order to disorder the surface-emitting quantum well structure only outside the emission region in the pump region, the emission region is preferably covered with a mask layer, for example a metal layer, for the purpose of finding the emission region. The mask layer is opaque to the electromagnetic radiation that brings about the disordering and thus prevents a disordering of the quantum well structure in the emission region.

BRIEF DESCRIPTION OF THE DRAWINGS

FIG. 1 shows a diagrammatic sectional view of an exemplary embodiment of a semiconductor device according to the invention, FIGS. 2A, 2B and 2C show a diagrammatic illustration of an exemplary embodiment of a production method according to the invention in three intermediate steps.

DETAILED DESCRIPTION OF THE DRAWINGS

Identical or identically acting elements are provided with the same reference symbols in the figures.

The semiconductor device illustrated in FIG. 1 comprises a substrate 1, on which a Bragg mirror 2 with a plurality of individual layers 3, a waveguide layer 4 with a plurality of further semiconductor layers, which will be explained in more detail below, and a covering layer 5 are applied epitaxially one after the other. A first contact layer 6 is arranged on that side of the substrate 1 which is opposite to the said layers and a second contact layer 7 corresponding to the said first contact layer is arranged on the covering layer 5.

An active pump layer 8 for generating the pump radiation 9, for example with a wavelength of 920 nm, and also a surface-emitting quantum well structure 10 with a plurality of quantum layers 11 are formed within the waveguide layer 4. The wavelength of the radiation generated by the surface-emitting quantum well structure is 980 nm, for example. By way of example, GaAs/AlGaAs-based materials are suitable as semiconductor material for the wavelengths mentioned.

The waveguide layer is preferably shaped as an LOC structure (known as Large Optical Confinement or Large Optical Cavity). The spatial distance between the quantum well structure and the active pump layer may be approximately 500 nm, for example.

In the lateral direction, the semiconductor device is subdivided into a central emission region 12 and an adjoining pump region 13. This subdivision is effected by the surface-emitting quantum well structure 10 being disordered in the pump region 13 generating zones 14 in which the absorption wavelength is less than the wavelength of the pump radiation and is approximately 900 nm, for example, while the absorption wavelength of the quantum well structure is greater than the wavelength of the pump radiation 9 in the emission region 12.

During operation, an operating current for generating the pump radiation is introduced into the active layer 8 via the contact layers 6 and 7. The active pump layer 8 forms a pump laser with the side areas 15 of the semiconductor device, so that a pump radiation field that is guided within the waveguide layer 4 is built up between the side areas 15.

On account of the disordering of the surface-emitting quantum well structure 10 in the outer pump region 13 and the lowering of the absorption wavelength thereby effected in the pump region, the pump radiation, in the pump region, is not absorbed in the surface-emitting quantum well structure. In the pump region, the surface-emitting quantum well structure is thus transparent to the pump radiation and remains passive, so that no optical pumping and, consequently, no radiation generation takes place here.

In the emission region, by contrast, the quantum well structure 10 is not disordered, so that the absorption wavelength is greater than the wavelength of the pump radiation. Therefore, the pump radiation is largely absorbed in the emission region in the quantum well structure and, by means of the optical pump process, excites the generation of radiation 16 which is emitted in the vertical direction. For coupling out the radiation 16, the contact layer 7 is cut out in the emission region 12.

In order to form a semiconductor disc laser with an external resonator, the Bragg mirror 2 is arranged between the substrate 1 and the surface-emitting quantum well structure 10, said Bragg mirror preferably comprising a plurality of alternate epitaxial layers 3 made of different semiconductor materials. Together with an external mirror 19, the Bragg mirror 2 forms a vertical resonator for the radiation 16 generated by the surface-emitting quantum well structure 10.

In the case of the production method shown in FIG. 2A, in a first step, a Bragg mirror 2 in the form of an alternate epitaxial layer sequence, a part 4a of the waveguide layer 4, the active pump layer 8 for generating the pump radiation 9, a further part 4b of the waveguide layer 4, the quantum well structure 10 with a plurality of quantum layers 11 and a part 4c of the waveguide layer 4 terminating on the top side, and also a covering layer 5 are grown epitaxially onto a substrate 1, FIG. 2a. These semiconductor layers can advantageously be produced in a single, common epitaxy step. A removal of a lateral partial region and a renewed growth of further layers are not necessary in this case. Moreover, it is possible to use plane epitaxial substrates.

In a second step of the production method, FIG. 2B, in the case of the invention, a mask layer 17, for example a metal layer is applied to the covering layer. The semiconductor device is thus subdivided in the lateral direction into an emission region 12 and a laterally adjoining pump region 13. In this case, the emission region 12 corresponds to that region of the semiconductor device which is covered by the mask layer 17 as seen in the vertical direction.

The quantum well structure is subsequently disordered in the pump region 13 thus defined, a diffusion-induced disordering (DID) being preferred in the case of the invention. The technique of disordering is described in the following articles: T. K. Ong et al., "High spatial-resolution quantum-well intermixing process in GaIn/As/GaInAsP laser structure using pulsed-photoabsorption-induced disordering", Journal of Applied Physics, Vol. 87, No. 6, 15 Mar. 2000, pages 2775–2779, J. Ralston, et al., "Intermixing of $Al_xGa_{1-x}As/GaAs$ superlattices by pulsed laser irradiation", Applied Physics Letter, Vol. 50, No. 25, 22 Jun. 1987, pages 1817–1819, and J. H. Marsh, "Laser induced quantum well intermixing for optoelectronic devices", _____ the contents of which are hereby incorporated by reference. For purposes of the present invention, the semiconductor device is irradiated with electromagnetic radiation 18, the wavelength of which is chosen in such a way that it is absorbed in the quantum well structure 10. Preferably, the wavelength of the electromagnetic radiation is greater than the pump wavelength, but less than the wavelength of the radiation 16 emitted by the quantum well structure 10 during operation. By way of example, given a pump wavelength of 920 nm and an emission wavelength of the surface-emitting quantum well structure of 980 nm, the wavelength of the electromagnetic radiation may be 940 nm.

A vertical selectivity of the disordering process is thus achieved, i.e. although the electromagnetic radiation is absorbed in the quantum well structure, it is not absorbed in the underlying active pump layer. The required lateral selectivity of the disordering process is ensured by the mask layer 17 already described.

The absorption of the electromagnetic radiation leads, in the pump region, to a local temperature increase in the region of the quantum well structure, which, upon exceeding a given temperature, leads to a disordering of the quantum well structure 10 and consequently to a lowering of the absorption wavelength of the quantum well structure in the zones 14 in the pump region 13. By way of example, the absorption wavelength of the quantum well structure can thus be lowered to 900 nm in the pump region, so that the quantum well structure is essentially transparent there to pump radiation having a wavelength of 920 nm.

If the wavelength of the electromagnetic radiation 18 is chosen to be greater than the absorption wavelength of the active pump layer 8, an absorption of the electromagnetic radiation in this active pump layer and thus a possible undesirable disordering of this layer are avoided.

Furthermore, in this method step, the rear-side contact layer 6 may also be applied to the substrate.

Finally, in a third method step, FIG. 2C, the mask layer 17 is removed or detached and the second contact layer 7 is applied in the pump region. By means of the preceding disordering, the quantum well structure 10, in the pump region 13, now has zones 14 in which the absorption wavelength of the quantum well structure, as already described, is less than the wavelength of the pump radiation, so that the pump radiation, in the pump region 13, can be guided toward the emission region 12 without absorption in the quantum well structure 10.

The explanation of the invention on the basis of the exemplary embodiment described is not to be understood as a restriction of the invention. In particular, the invention also encompasses all combinations of the features mentioned in the patent claims and all combinations of the features mentioned in the context of the exemplary embodiments and the rest of the description, even if these combinations are not explicitly the subject-matter of a patent claim.

I claim:

1. Optically pumped radiation-emitting semiconductor device with a surface-emitting quantum well structure (10), which has at least one quantum layer (11), and an active pump layer (8) for generating pump radiation (9) which is arranged parallel to the at least one quantum layer (11), wherein the semiconductor device has at least one emission region (12), in which the quantum well structure (10) is optically pumped, and at least one pump region (13), the quantum layer structure (10) and the active pump layer (8) extending over the pump region (13) and over the emission region (12) of the semiconductor device and the pump radiation being coupled into the emission region (12) in the lateral direction.

2. Semiconductor device according to claim 1, wherein the active pump layer (8) and the quantum well structure (10) are arranged within a common waveguide (4).

3. Semiconductor device according to claim 1, wherein the absorption wavelength of the quantum well structure (10) is greater than the wavelength of the pump radiation (9) within the emission region (12) and is less than the wavelength of the pump radiation (9) outside the emission region (12).

4. Semiconductor device according to claim 1, wherein the quantum well structure (10) is at least partly disordered outside the emission region (12).

5. Semiconductor device according to claim 1, wherein the semiconductor device, for generating the pump radiation (9) has a pump laser with the active pump layer (8) as laser-active medium.

6. Semiconductor device according to claim 5, wherein the pump laser has a laser resonator, the emission region at least partly overlapping the laser resonator as seen in the vertical direction.

7. Semiconductor device according to claim 1, wherein the emission region (12) comprises a mirror layer (2), preferably a Bragg mirror, or in that a mirror layer (2) preferably a Bragg mirror, is arranged downstream of the emission region (12) in the vertical direction.

8. Semiconductor device according to claim 1, wherein the semiconductor device is formed as an optically pumped semiconductor disc laser.

9. Semiconductor device according to claim 1, wherein the pump region (13) and the emission region (12) are formed in monolithically integrated fashion.

10. Method for producing an optically pumped radiation-emitting semiconductor device with a surface-emitting quantum well structure (10), which has at least one quantum layer (11), and an active pump layer (8) for generating pump radiation (9) which is arranged parallel to the at least one quantum layer (11), the semiconductor device having an emission region (12), in which the quantum well structure (10) is optically pumped, and a pump region (13), the quantum well structure (10) and the active pump layer (8) extending over the pump region (13) and over the emission region (12) of the semiconductor device, and the pump radiation (9) being coupled into the emission region (12) in the lateral direction, comprising the following steps:

providing a substrate, growing a semiconductor layer or semiconductor layer sequence, comprising the active pump layer (8), growing a semiconductor layer or semiconductor layer sequence, comprising the surface-emitting quantum well structure (10) with at least one quantum layer (11), defining at least one emission region (12) and at least one pump region (13) in the lateral direction, and disordering of the quantum well structure (10) in the pump region (13).

11. Method according to claim 10, wherein the quantum well structure (10) is disordered by irradiation with electromagnetic radiation (18), preferably by means of a laser.

12. Method according to claim 11, wherein the quantum well structure (10) is disordered by irradiation with laser pulses.

13. Method according to claim 10, wherein the wavelength of the electromagnetic radiation (18) is chosen such that it is absorbed within the quantum well structure (10), but not within the active pump layer (8).

14. Method according to claim 10, wherein the wavelength of the electromagnetic radiation (18) is less than the emission wavelength of the surface-emitting quantum well structure (10) and greater than the wavelength of the pump radiation (9).

15. Method according to claim 10, wherein in order to define the emission region (12), prior to the disordering of the quantum well structure (10), a mask layer (17), is applied to the emission region (12).

16. Method according to claim 15, wherein said mask layer is a reflective mask layer.

17. Method according to claim 15, wherein said mask layer is a metallic mask layer.

* * * * *